United States Patent
Choi et al.

(10) Patent No.: US 8,357,613 B2
(45) Date of Patent: Jan. 22, 2013

(54) METHODS OF FABRICATING SEMICONDUCTOR DEVICES AND SEMICONDUCTOR DEVICES INCLUDING A CONTACT PLUG PROCESSED BY RAPID THERMAL ANNEALING

(75) Inventors: Suk-Hun Choi, Suwon-si (KR);
Chang-Ki Hong, Seongnam-si (KR);
Jae-Hyoung Choi, Hwaseong-si (KR);
Yoon-Ho Son, Yongin-si (KR);
Min-Young Park, Suwon-si (KR);
Yong-Suk Tak, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 170 days.

(21) Appl. No.: 12/656,673

(22) Filed: Feb. 12, 2010

(65) Prior Publication Data
US 2010/0203725 A1 Aug. 12, 2010

(30) Foreign Application Priority Data
Feb. 12, 2009 (KR) .................. 10-2009-0011506

(51) Int. Cl.
*H01L 21/44* (2006.01)
(52) U.S. Cl. .................. 438/672; 257/E21.585
(58) Field of Classification Search .................. 438/660, 438/663, 666, 667, 672, 675
See application file for complete search history.

(56) References Cited

U.S. PATENT DOCUMENTS

| | | | | |
|---|---|---|---|---|
| 6,153,526 A * | 11/2000 | Shih et al. | ...... | 438/692 |
| 6,638,861 B1 | 10/2003 | Ngo et al. | | |
| 2003/0022801 A1 * | 1/2003 | Sun et al. | ...... | 510/175 |
| 2004/0038530 A1 * | 2/2004 | Shin et al. | ...... | 438/685 |
| 2006/0046492 A1 * | 3/2006 | Peng et al. | ...... | 438/694 |
| 2006/0151887 A1 * | 7/2006 | Oh et al. | ...... | 257/774 |
| 2008/0247214 A1 * | 10/2008 | Ufert | ...... | 365/148 |

FOREIGN PATENT DOCUMENTS

| | | |
|---|---|---|
| JP | 2003-507888 T | 2/2003 |
| JP | 2005-508573 T | 3/2005 |
| KR | 10-2002-0020969 A | 3/2002 |
| KR | 10-2003-0053156 A | 6/2003 |
| KR | 10-2005-004376 A | 5/2005 |
| WO | WO 01/13426 A1 | 2/2001 |

* cited by examiner

*Primary Examiner* — Charles Garber
*Assistant Examiner* — Calvin Choi
(74) *Attorney, Agent, or Firm* — Lee & Morse, P.C.

(57) ABSTRACT

A method of fabricating a semiconductor device includes depositing tungsten on an insulating layer in which a contact hole is formed by chemical vapor deposition (CVD), performing chemical mechanical planarization (CMP) on the tungsten to expose the insulating layer and form a tungsten contact plug, and performing rapid thermal oxidation (RTO) on the tungsten contact plug in an oxygen atmosphere such that the tungsten expands volumetrically into tungsten oxide ($W_\xi O_\psi$).

13 Claims, 10 Drawing Sheets

| Time,(t), s | Fractional conversion, & |
|---|---|
| 60 | 40 |
| 180 | 67.7 |
| 630 | 90.8 |
| 1800 | 100 |

FIG. 12

| SPLIT CONDITIONS | BEC CS (W/cnt) | | | | | |
|---|---|---|---|---|---|---|
| | AVG | T | C | B | L | R |
| RTA-W:500°C, 5 MINUTES | 190 | 192 | 190 | 191 | 189 | 188 |
| RTA-W:500°C, 10 MINUTES | 275 | 274 | 276 | 276 | 276 | 275 |
| | 252 | 253 | 252 | 250 | 252 | 252 |
| W Plug | 119 | 120 | 120 | 118 | 118 | 120 |

| SPLIT CONDITIONS | BEC CS (W/cnt) | | | | | |
|---|---|---|---|---|---|---|
| | AVG | T | C | B | L | R |
| RTA-W (500°C, 5 MINUTES) | 190 | 192 | 190 | 191 | 189 | 188 |
| RTA-W+RTH (650°C, 2 MINUTES) | 138 | 138 | 137 | 138 | 138 | 139 |
| RTA-W+RT-NH (650°C, 2 MINUTES) | 141 | 140 | 142 | 141 | 141 | 142 |
| W Plug | 119 | 120 | 120 | 118 | 118 | 120 |

| SPLIT CONDITIONS | BEC CS (W/cnt) | | | | | |
|---|---|---|---|---|---|---|
| | AVG | T | C | B | L | R |
| RTA-W (500°C, 10 MINUTES) | 275 | 274 | 276 | 276 | 276 | 275 |
| | 252 | 253 | 250 | 250 | 252 | 252 |
| RTA-W+RTH (650°C, 2 MINUTES) | 150 | 148 | 150 | 149 | 151 | 151 |
| | 147 | 148 | 148 | 147 | 148 | 147 |
| RTA-W+RT-NH (650°C, 2 MINUTES) | 171 | 170 | 171 | 171 | 172 | 173 |
| W Plug | 119 | 120 | 120 | 118 | 118 | 120 |

FIG. 17

METHODS OF FABRICATING SEMICONDUCTOR DEVICES AND SEMICONDUCTOR DEVICES INCLUDING A CONTACT PLUG PROCESSED BY RAPID THERMAL ANNEALING

BACKGROUND

1. Field

Embodiments relate to methods of fabricating semiconductor devices. More particularly, embodiments relate to methods of fabricating semiconductor devices in which a tungsten contact plug is processed by rapid thermal annealing (RTA) in an oxygen atmosphere to remove a partial step.

2. Description of Related Art

Today's rapidly developing information-oriented society demands semiconductor devices having high data transmission rates that can rapidly process large amounts of information. To increase the data transmission rate of a semiconductor device, design rules of semiconductor devices are being gradually reduced in order to integrate more and more cells on each single chip.

That is, to form more and more patterns on a semiconductor substrate, pattern intervals and widths are being reduced. Patterns having a narrow width may be formed in multiple layers, and an interlayer insulating layer is formed to electrically insulate the patterns in the respective layers from each other. In the interlayer insulating layer, contacts and vias are formed to electrically connect the patterns in the respective layers. The contacts or vias are formed by forming predetermined openings in the interlayer insulating layer and filling the openings with a conductive material. Thus, to form the contacts and vias in a desired region only, the interlayer insulating layer should be densely and uniformly formed without an inner void.

That is, the interlayer insulating layer should be formed such that a space between the patterns formed in the respective layers is densely filled with the conductive material. However, as design rules are reduced, aspect ratios of the patterns generally increase. Thus, when a space between the patterns having higher aspect ratios is filled with the conductive material, the narrow space is not completely filled with the conductive material, and an empty space, i.e., a void, is formed.

More particularly, a metal contact plug of a semiconductor device may be formed by sputtering aluminum (Al). However, when the aspect ratio is high, it is difficult to ensure the step coverage of such an aluminum contact. Further, high density plasma enhanced chemical vapor deposition (HDPCVD) may be used as a gap-filling method when the aspect ratio is high. However, even when the HDPCVD method is used, a void or seam is still formed, e.g., for a design rule of a critical dimension (CD) of 0.2 μm or less. Consequently, a poor contact may result.

SUMMARY

Embodiments are therefore directed to methods of forming semiconductor devices, which substantially overcome one or more of the problems due to the limitations and disadvantages of the related art.

It is therefore a feature of an embodiment to provide methods of forming semiconductor devices in which a contact plug having lower resistivity and/or improved step coverage as compared to comparable conventional contact plugs, e.g., an aluminum contact plug.

It is therefore a separate feature of an embodiment to provide methods of forming semiconductor devices in which a seam formed in the contact plug may be reduced and/or eliminated.

It is therefore a separate feature of an embodiment to provide methods of forming semiconductor devices in which a contact plug is formed using tungsten having excellent contact resistance as compared to, e.g., aluminum having poor step coverage.

It is therefore a separate feature of an embodiment to provide methods of forming semiconductor devices in which contact resistance of tungsten increased as tungsten is heat-treated in a high-temperature oxygen atmosphere is decreased.

It is therefore a separate feature of an embodiment to provide methods of fabricating semiconductor devices in which a tungsten contact plug is processed by rapid thermal annealing (RTA) in an oxygen atmosphere to remove a partial step, and a rapid thermal oxidation (RTO)-processed tungsten contact plug is reduced in a hydrogen atmosphere to improve contact resistance.

It is therefore a separate feature of an embodiment to provide methods of fabricating semiconductor devices in which tungsten is processed by RTO in a high-temperature oxygen atmosphere to remove partial steps of a seam formed as tungsten grains grow from three sides when the tungsten is deposited in a contact hole and a dishing formed by recessing the tungsten according to an etch selectivity between the tungsten and an oxide or a protrusion formed by protruding the tungsten when the tungsten deposited to overfill the contact hole is processed by chemical mechanical planarization (CMP), the tungsten that is volumetrically expanded upward is processed by buffing CMP, and tungsten oxide is processed by rapid thermal hydrogenation (RTH) in a high-temperature hydrogen atmosphere to improve contact resistance increased due to the heat treatment and transformed into pure tungsten by a reduction reaction.

At least one of the above and other features and advantages may be realized by providing a method of fabricating a semiconductor device, including depositing tungsten on an insulating layer in which a contact hole is formed by chemical vapor deposition (CVD), performing chemical mechanical planarization (CMP) on the tungsten to expose the insulating layer and form a tungsten contact plug, and performing rapid thermal oxidation (RTO) on the tungsten contact plug in an oxygen atmosphere such that the tungsten expands volumetrically into tungsten oxide ($W_\xi O_\psi$).

The RTO may include a heating process of heating the tungsten at a high temperature of 400° C. or more for one minute or more and/or a plasma process of heating the tungsten at a power of 20 watts or more for one minute or more.

The CMP may be a single step process during which a ratio of oxygenated water used as a slurry to a total content is 2% or more, and the tungsten has a higher etch selectivity than oxide of the insulating layer, such that the tungsten contact plug is dished while a part of the tungsten having the higher etch selectivity is recessed, and the dished tungsten contact plug expands uniformly and volumetrically in a vertical direction during the RTO.

The CMP may include two steps, wherein, during a first step, a ratio of oxygenated water used as a slurry to a total content is 2% or more, the tungsten has a higher etch selectivity than oxide of the insulating layer, and a part of the tungsten having the higher etch selectivity is recessed, and, during a second step, a ratio of oxygenated water used as a slurry to a total content is 0.5% or less, the tungsten has a lower etch selectivity than the oxide of the insulating layer, and the tungsten contact plug protrudes while the oxide having the higher etch selectivity is removed such that a surface of the tungsten protrudes, and the protruding tungsten contact plug expands volumetrically in random directions during the RTO.

The method may include, after performing the RTO, removing a part of the tungsten that has volumetrically expanded upward from a surface of the insulating layer by buffing CMP for ten seconds or less to leave only a part of the tungsten that has volumetrically expanded.

The method may include, after the buffing CMP, reducing the tungsten and transforming the tungsten oxide ($W_\xi O_\psi$) to pure tungsten (W) by performing rapid thermal hydrogenation (RTH) or rapid thermal ammoniation (RTNH) on the contact plug in a hydrogen or ammonia atmosphere.

The RTH or RTNH may include a heating process during which heating method may be performed on the tungsten oxide ($W_\xi O_\psi$) at a high temperature of 400° C. or more.

A speed at which the tungsten oxide ($W_\xi O_\psi$) is reduced to the tungsten (W) when hydrogen or ammonia molecules react with the tungsten oxide ($W_\xi O_\psi$) may be proportional to a hydrogen pressure, a reaction temperature, and a reaction time.

The RTH or RTNH may include a plasma process.

At least one of the above and other features and advantages may be separately realized by providing a method of fabricating a semiconductor device including a semiconductor substrate on which an oxide insulating layer is formed and includes at least one contact hole formed therein, the method including depositing tungsten on the semiconductor substrate including the contact hole until the contact hole is overfilled, forming a tungsten contact plug by planarizing the semiconductor substrate including the tungsten using a chemical mechanical planarization (CMP) process until the insulating layer is exposed, performing rapid thermal oxidation (RTO) on the tungsten contact plug in an oxygen atmosphere and oxidizing the tungsten to tungsten oxide, and removing a part of the tungsten oxide that has volumetrically expanded upward from the surface of the insulating layer when the tungsten (W) is oxidized to the tungsten oxide ($W_\xi O_\psi$) by buffing CMP.

The method may include reducing the tungsten oxide ($W_\xi O_\psi$) to pure tungsten (W) by performing rapid thermal hydrogenation (RTH) or rapid thermal ammoniation (RTNH) on the contact plug in a hydrogen or ammonia atmosphere.

The method may include transforming the tungsten oxide ($W_\xi O_\psi$) into pure tungsten (W) by performing rapid thermal nitridation (RTN) on the tungsten oxide in a nitrogen atmosphere and nitriding the tungsten oxide.

At least one of the above and other features and advantages may be separately realized by providing a semiconductor device, including a semiconductor substrate, an oxide insulating layer on the semiconductor substrate, a tungsten contact plug extending through the oxide insulating layer, the tungsten contact plug including tungsten that has been subjected to a chemical mechanical planarization (CMP) process, and a rapid thermal oxidation (RTO) in an oxygen atmosphere such that the tungsten contact plug includes tungsten oxide, and a buffing CMP process.

The tungsten contact plug may include tungsten oxide.

The tungsten contact plug may have been subjected to a rapid thermal nitridation (RTN) on the tungsten oxide in a nitrogen atmosphere and nitriding of the tungsten oxide such that the tungsten oxide is transformed into pure tungsten, and the tungsten contact plug includes pure tungsten.

A seam may be wholly contained within the tungsten contact plug.

BRIEF DESCRIPTION OF THE DRAWINGS

The above and other features and advantages will become more apparent to those of ordinary skill in the art by describing in detail exemplary embodiments with reference to the attached drawings, in which.

DETAILED DESCRIPTION OF EXEMPLARY EMBODIMENTS

Korean Patent Application No. 10-2009-0011506, filed on Feb. 12, 2009, in the Korean Intellectual Property Office, and entitled: "Method of Fabricating Semiconductor Device," is incorporated by reference herein in its entirety.

Various embodiments will now be described more fully with reference to the accompanying drawings in which some exemplary embodiments are shown. However, specific structural and functional details disclosed herein are merely representative for purposes of describing example embodiments. In the drawings, the thicknesses of layers and regions may be exaggerated for clarity. Further, it is understood that aspects may be embodied in many alternate forms and should not be construed as limited to only exemplary embodiments set forth herein. It will also be understood that when an element is referred to as being "on" another element, it can be directly on the other element, or intervening elements may also be present. Like reference numerals refer to like elements throughout the specification.

In the following description of exemplary embodiments, a contact plug including a heat-resistant metal, e.g., tungsten, having better contact resistance characteristics than, e.g., aluminum, will be described in conjunction with the exemplary embodiments. Tungsten (W) has a relatively low resistivity of 5 ($\mu\Omega$)(cm) to 10 ($\mu\Omega$)(cm), has a relatively high melting point, and has excellent thermal stability with silicon. More particularly, in embodiments of methods of fabricating semiconductor devices described herein, a contact plug including, e.g., tungsten, may be processed in an oxygen atmosphere by rapid thermal annealing (RTA). In such embodiments, the tungsten plug processed by rapid thermal oxidation (RTO) may be reduced in a hydrogen atmosphere to decrease a contact resistance of the tungsten plug. Embodiments may provide semiconductor devices including relatively thinner line widths and/or higher aspect ratios than comparable conventional devices, while having, e.g., lower resistivity, improved step coverage and/or reduced, seam characteristics as compared to comparable conventional contact plugs will be described herein.

Figure 1:
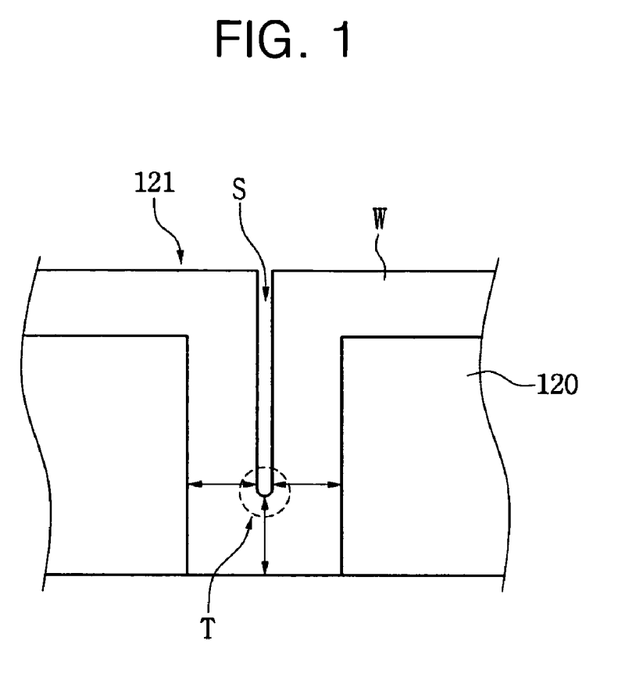
FIG. 1 illustrates a cross-sectional view of semiconductor device during a process of forming a contact plug.

FIG. 1 illustrates a cross-sectional view of semiconductor device during a process of forming a contact plug.

Referring to FIG. 1, a contact hole 121 may be formed in an interlayer insulating layer 120, and chemical vapor deposition (CVD) may be employed, e.g., to plug the contact hole 121. More particularly, the interlayer insulating layer 120 may be formed on a semiconductor substrate (not shown) including, e.g., source and drain regions, and may be etched using a mask defining a contact, e.g., as a bit line, to form one or more contact holes 121 exposing a predetermined region of the semiconductor substrate. CVD may then be employed to deposit tungsten W on the interlayer insulating layer 120 and to fill the contact hole 121 in the interlayer insulating layer 120. Although not shown, before the tungsten W is deposited, a barrier layer including, e.g., titanium (Ti), etc., may be deposited on the interlayer insulating layer 120. The deposited tungsten W may then be etched back to expose, e.g., an upper surface of the interlayer insulating layer 120 and to form a tungsten contact plug in the contact hole 121.

Referring to FIG. 1, when the contact hole 121 has a high aspect ratio, when, e.g., the contact hole 121 is filled with tungsten by CVD, a seam or void S may be formed. More particularly, the seam may be formed at a triple point T. That is, tungsten grains may grow in three directions (arrow directions in FIG. 1) from the bottom and both sidewalls of the contact hole and meet one another at a point, and the meeting point is referred to as a triple point T. A seam or void may be vertically formed from the triple point T.

Such a seam or void S increases surface roughness, thereby increasing a surface area and electrical resistance of the contact plug. The seam S may remain even after a chemical mechanical planarization (CMP) process that may be employed to remove excessive tungsten W, and expose the interlayer insulating layer 120. Further, e.g., during the CMP process, a slurry, etc., may be inserted into the seam S and may further increase contact resistance. The seam S may further expand during subsequent processing, e.g., during a subsequent cleaning process. More particularly, the seam S may exist at a position at which a contact electrode or phase change pattern is formed in a phase change memory device, and thus, may greatly increase the electrical resistance of a metal interconnection. As a result, the seam S may cut the flow of current provided to the phase change pattern.

Figure 2:
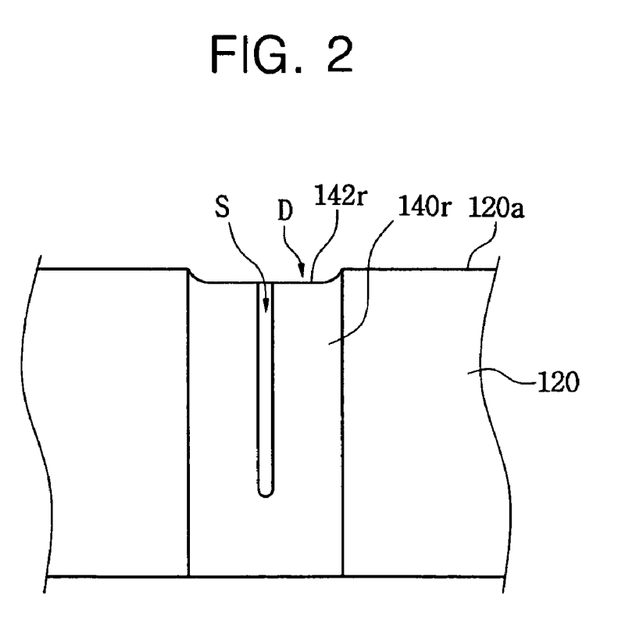
FIG. 2 illustrates a cross-sectional view of the semiconductor device of FIG. 1 after being subjected to one-step chemical mechanical planarization (CMP) and resulting in a dished-type tungsten contact plug.
Figure 3:
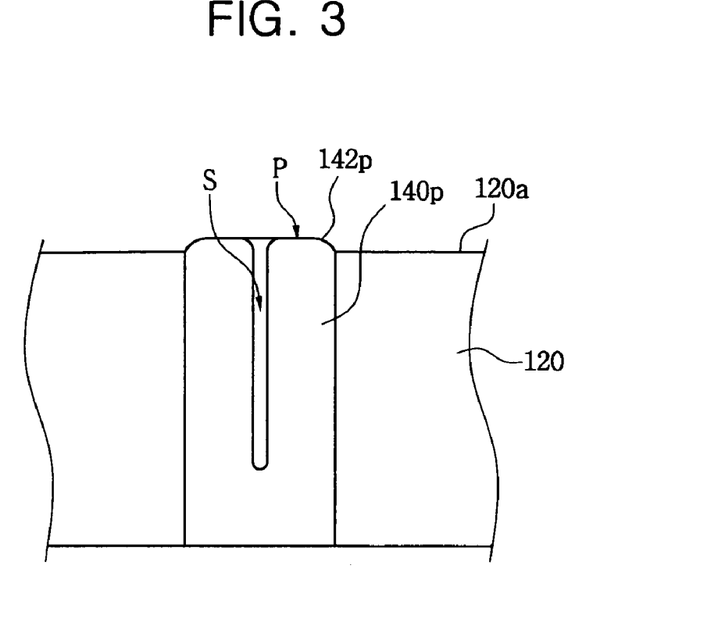
FIG. 3 illustrates a cross-sectional view of the semiconductor device of FIG. 1 after being subjected to two-step CMP and resulting in a protrusion-type tungsten contact plug.

Other characteristics may increase surface roughness and resistance of a contact plug. More particularly, surface roughness may occur as a result of an etch selectivity between the tungsten W and an oxide during a CMP process for planarizing a surface to form the tungsten contact plug. FIG. 2 illustrates a cross-sectional view of the semiconductor device of FIG. 1 after being subjected to one-step chemical mechanical planarization (CMP) and resulting in a dished-type tungsten contact plug. FIG. 3 illustrates a cross-sectional view of the semiconductor device of FIG. 1 after being subjected to two-step CMP and resulting in a protrusion-type tungsten contact plug.

For example, when CMP is performed in one step, a slurry used may have an oxygenated water ($H_2O_2$)-to-total content ratio of 2% or more to have high polishing power to polish the tungsten W. Referring to FIG. 2, as a result of the planarization process, while the tungsten W overfilling the interlayer insulating layer 120 is removed, a surface 142 of the tungsten W having a high etch selectivity may also be partially recessed, and a concavity may be formed. Thus, the resulting surface 142 of a tungsten plug 140r may have a dish shape in which the tungsten W is recessed with respect to an upper surface 120a of the interlayer insulating layer 120. Such processing which results in a recessed or dish shape tungsten plug 140r may be referred to as a dishing, and reference term D of FIG. 2 denotes the dishing of the surface 142.

Referring to FIG. 3, CMP may be performed in two steps to prevent the tungsten W from being excessively etched as a result of, e.g., the tungsten W having a high etch selectivity than the oxide. In such cases, a slurry having a high selectivity with respect to the tungsten W may be used in the first step CMP, and a slurry having a high selectivity with respect to the oxide may be used to prevent and/or reverse dishing in the second step CMP. More particularly, the slurry used for the second step may have an oxygenated water ($H_2O_2$)-to-total content ratio of 0.5% or less. During the second step of such a planarization process, while the interlayer insulating layer 120 may be removed, a surface 142p of a resulting tungsten plug 140p may protrude upward relative to the upper surface 120a of the interlayer insulating layer 120. Referring to FIG. 3, the surface 142p of the tungsten plug 140p may be convex, and thus, will be referred to as a protrusion. Reference mark P of FIG. 3 denotes a protrusion.

As discussed above and illustrated in FIGS. 2 and 3, in some embodiments, the contact plug 140r, 140p may be formed by depositing, e.g., tungsten, via, e.g., CVD, on a semiconductor substrate (not shown), and excess tungsten W may be etched to expose the interlayer insulating layer 120. As discussed above, the resulting contact plug, e.g., 140r, 140p, may have undesired and/or unacceptable electrical characteristics as a result of, e.g., increasing aspect ratios and/or reduced line widths that may be employed in an attempt to increase cell integration.

Embodiments may provide methods of suppressing surface roughness of the contact plug, e.g., 140r, 140p, as a result of, e.g., a partial step from the seam S, dishing, and/or protrusion. More particularly, surface roughness may be substantially and/or completely removed using a characteristic that the tungsten contact plug 140r, 140p may expand volumetrically when subjected to a high temperature in an oxygen atmosphere. For example, at least a portion of the seam S, and, more particularly, an upper portion of the seam S at the surface 142r, 142p of the tungsten contact plug 140r, 140p may be eliminated. More specifically, e.g., when the CMP-processed tungsten contact plug 140r, 140p of FIGS. 2 and 3 is oxidized at a high temperature, the tungsten W grows. Such features will be further described in connection with FIGS. 4 and 5.

Figure 4:
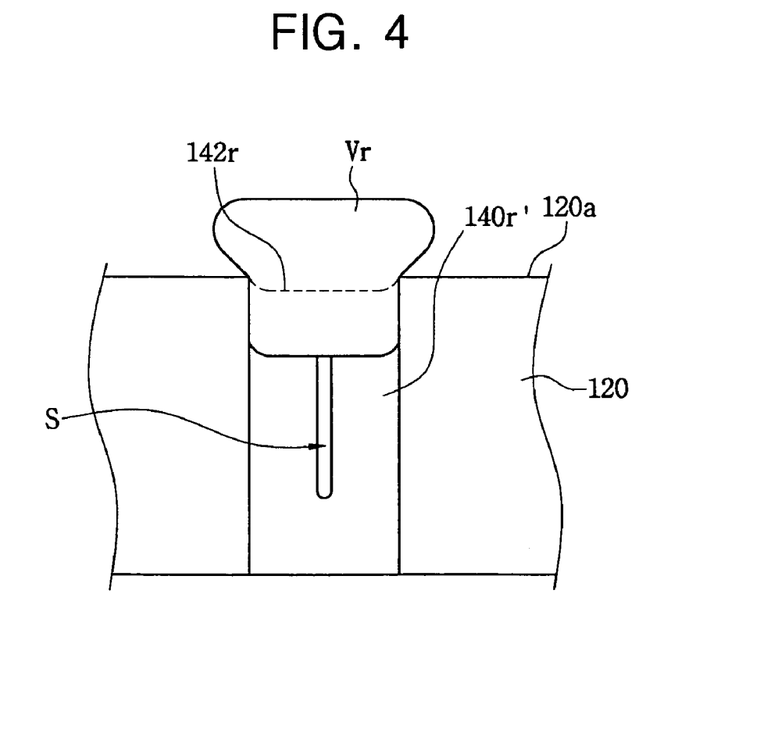
FIG. 4 illustrates a cross-sectional view of the semiconductor device of FIG. 2 after the dished-type tungsten plug is processed by rapid thermal annealing (RTA) in an oxygen atmosphere and expands volumetrically according to exemplary embodiments.
Figure 5:
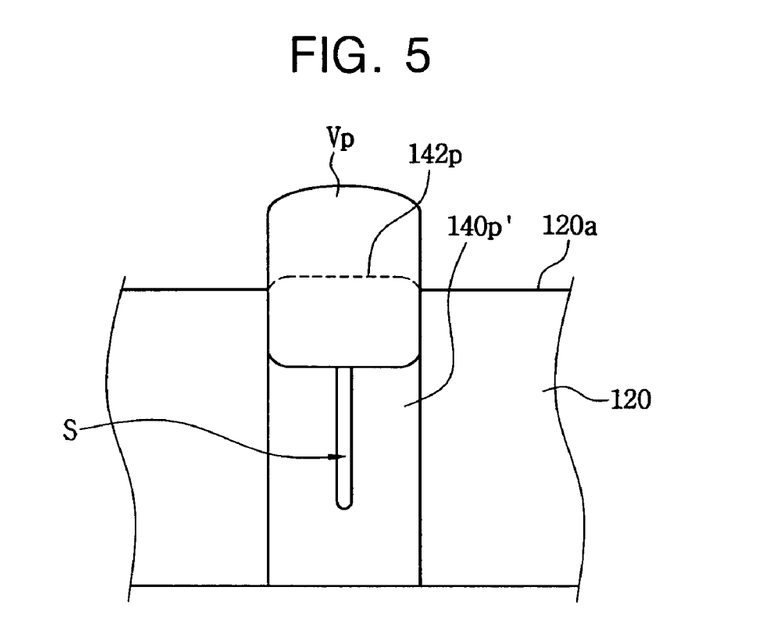
FIG. 5 illustrates a cross-sectional view of the semiconductor device of FIG. 3 after the protrusion-type tungsten plug is processed by RTA in an oxygen atmosphere and expands volumetrically according to exemplary embodiments.
Figure 6:
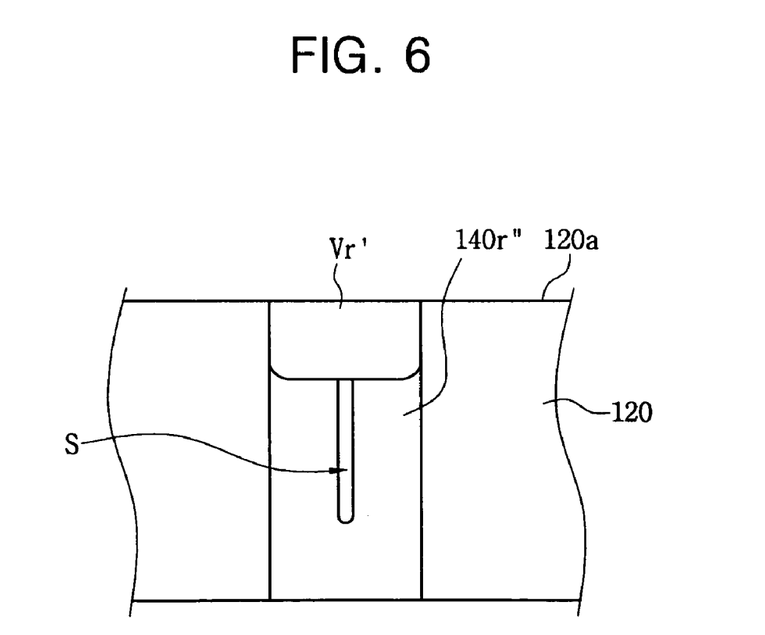
FIG. 6 illustrates a cross-sectional view of the semiconductor device of FIG. 4 after the dished-type contact plug is processed by buffing CMP after RTA according to exemplary embodiments.
Figure 7:
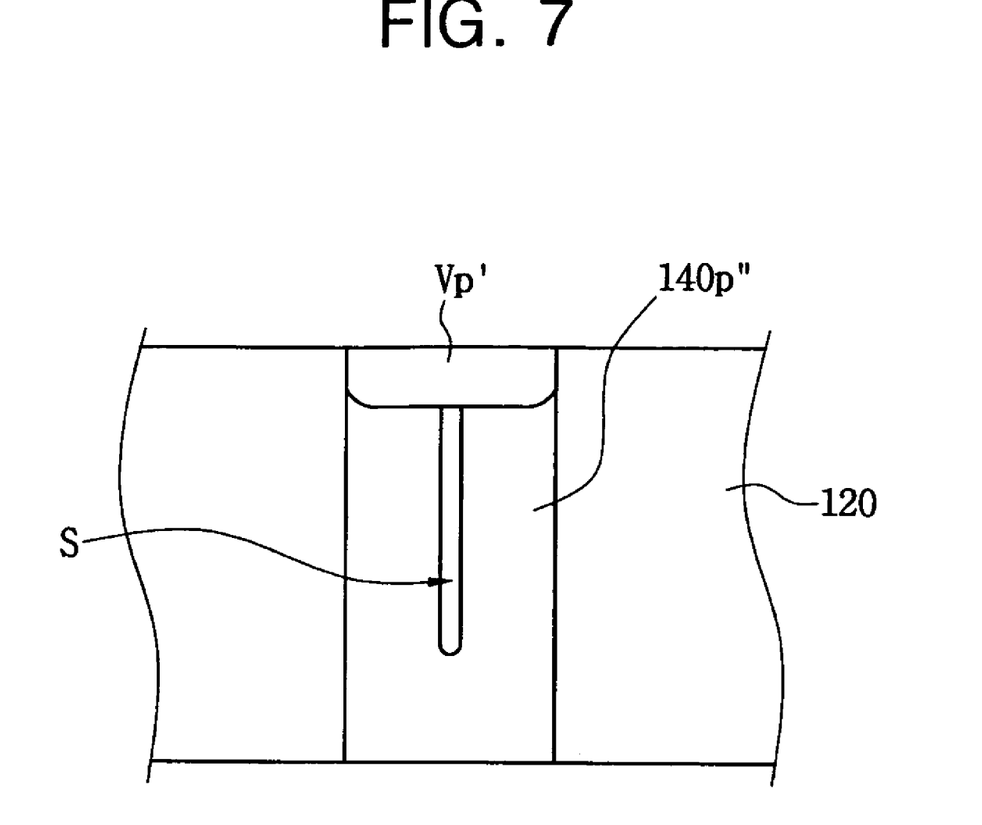
FIG. 7 illustrates a cross-sectional of the semiconductor device of FIG. 5 after the protrusion-type contact plug is processed by buffing CMP after RTA according to exemplary embodiments.

FIG. 4 illustrates a cross-sectional view of the semiconductor device of FIG. 2 after the dished-type tungsten plug 140r is processed by rapid thermal annealing (RTA) in an oxygen atmosphere and expands volumetrically according to exemplary embodiments. FIG. 5 illustrates a cross-sectional view of the semiconductor device of FIG. 3 after the protrusion-type tungsten plug 140p is processed by RTA in an oxygen atmosphere and expands volumetrically according to exemplary embodiments. FIG. 6 illustrates a cross-sectional view of the semiconductor device of FIG. 4 after a dished-type contact plug 140r" is formed by performing buffing CMP after RTA of the dished-type contact plug 140e of FIG. 2 according to exemplary embodiments. FIG. 7 illustrates a cross-sectional of the semiconductor device of FIG. 5 after a protrusion-type contact plug 140p" is formed by performing buffing CMP after RTA of the protrusion-type contact plug 140p of FIG. 3 according to exemplary embodiments.

Referring to FIGS. 4 and 5, by subjecting the tungsten contact plugs 140r, 140p of FIGS. 2 and 3, respectively, to an RTO process, the tungsten W may grow, i.e., a volume of the tungsten W may expand, and form tungsten contact plugs 140r' and 140p', respectively. In general, the tungsten contact plug 140r, 140p may expand from its exposed upper part and, more particularly, the exposed surface 142r, 142p. In FIGS. 4 and 5, Vr, Vp correspond to the expanded part of the tungsten W. In embodiments, a heating method or plasma method may be used as an annealing method for RTO. The heating method may be performed at a high temperature of 400° C. or more in an oxygen atmosphere for one or more minutes. The plasma method may be performed at a power of 20 watts or more for one or more minutes.

More particularly, referring to FIGS. 2, 3, 4 and 5, the grown shape of the tungsten W may vary according to the CMP process employed. Referring to FIGS. 2, and 4, when a CMP process is performed in one step, the contact plug 140r may have a dishing shape in which the surface 142r of the contact plug 140r is lower than an upper surface 120a of the interlayer insulating layer 120, as illustrated in FIG. 2. Thus, in such cases, the tungsten W may expand volumetrically in random directions from the surface 142r and/or a surface of the seam S by a RTO process, as illustrated in FIG. 4. Referring to FIGS. 3 and 5, when a CMP process is performed in two steps, the contact plug 140p may have a protrusion shape in which the surface 142p of the contact plug 140p may protrude upward from the upper surface 120a of the interlayer insulating layer 120, as illustrated in FIG. 3. Thus, in such cases, the tungsten W may expand substantially uniformly and volumetrically in a vertical direction from the surface 142p and/or a surface of the seam S by a RTO process as illustrated in FIG. 5.

Referring to FIGS. 4 and 5, a thickness of the tungsten W grown from subjecting the dishing-type tungsten plug 140r to an RTO process may be larger than a thickness of the tungsten W grown from subjecting the protrusion-type tungsten plug 140p to an RTO process.

Referring to FIGS. 6 and 7, an upper part of the tungsten contact plug 140r, 140p may be polished to remove a portion of the grown tungsten Vp, Vr above the upper surface 120a of the interlayer insulating layer 120. At this stage, instead of a CMP process, which may not be appropriate for local polishing, the excess tungsten W may be removed and the tungsten plugs 140r", 140p" may be formed by buffing CMP. As a result, an upper surface of the tungsten contact plug 140 may be flat by a buffing CMP process and the surface roughness of the surfaces 142r, 142p of FIGS. 2 and 3 may be reduced and/or eliminated. More particularly, remaining portions Vr', Vp' of the grown tungsten plug 140r", 140p" may be a substantially and/or completely flat and smooth surface. The buffing CMP process may be performed for ten seconds or less.

Thus, embodiments may provide methods for reducing and/or eliminating a surface roughness of a contact plug, e.g., 140r", 140p", that may result, e.g., from a seam S formed during CVD. More particularly, by subjecting the contact plug 140r, 140p to a RTO, a partial step, e.g., a seam, dishing or protrusion, may be reduced and/or eliminated from at least an upper surface of the contact plug, e.g., 140r", 140p". However, the RTO process may result in an increase in a resistance of the resulting contact plugs 140r", 140p".

Figure 8:
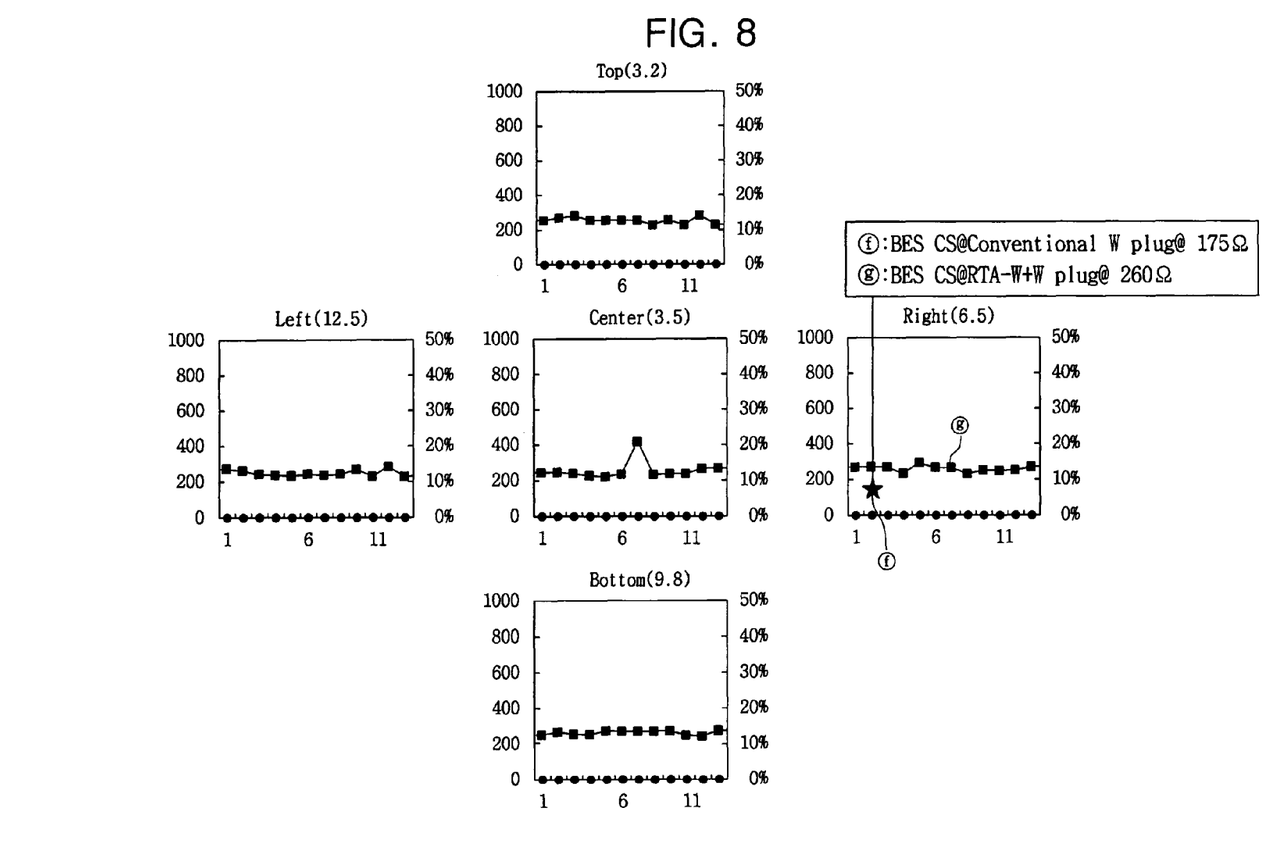
FIG. 8 illustrates graphs of resistance values of tungsten that is oxidized through a rapid thermal oxidation (RTO) process and buffed through a CMP process according to exemplary embodiments.

FIG. 8 illustrates graphs of resistance values of tungsten that is oxidized through a rapid thermal oxidation (RTO) process and buffed through a CMP process according to exemplary embodiments. Referring to FIG. 8, tungsten that is oxidized through a RTO process and buffed through a CMP process has a higher resistance than a reference contact plug, that is, tungsten that is not processed by RTA. In FIG. 8, (f) is a resistance value (175Ω) of reference tungsten, and (g) is a resistance value (260Ω) of tungsten processed by buffing CMP after RTO. Thus, referring to FIG. 8, it may be seen that a resistance of RTA-processed tungsten may be higher by about 85Ω than the resistance value (175Ω) of reference tungsten.

Figure 9:
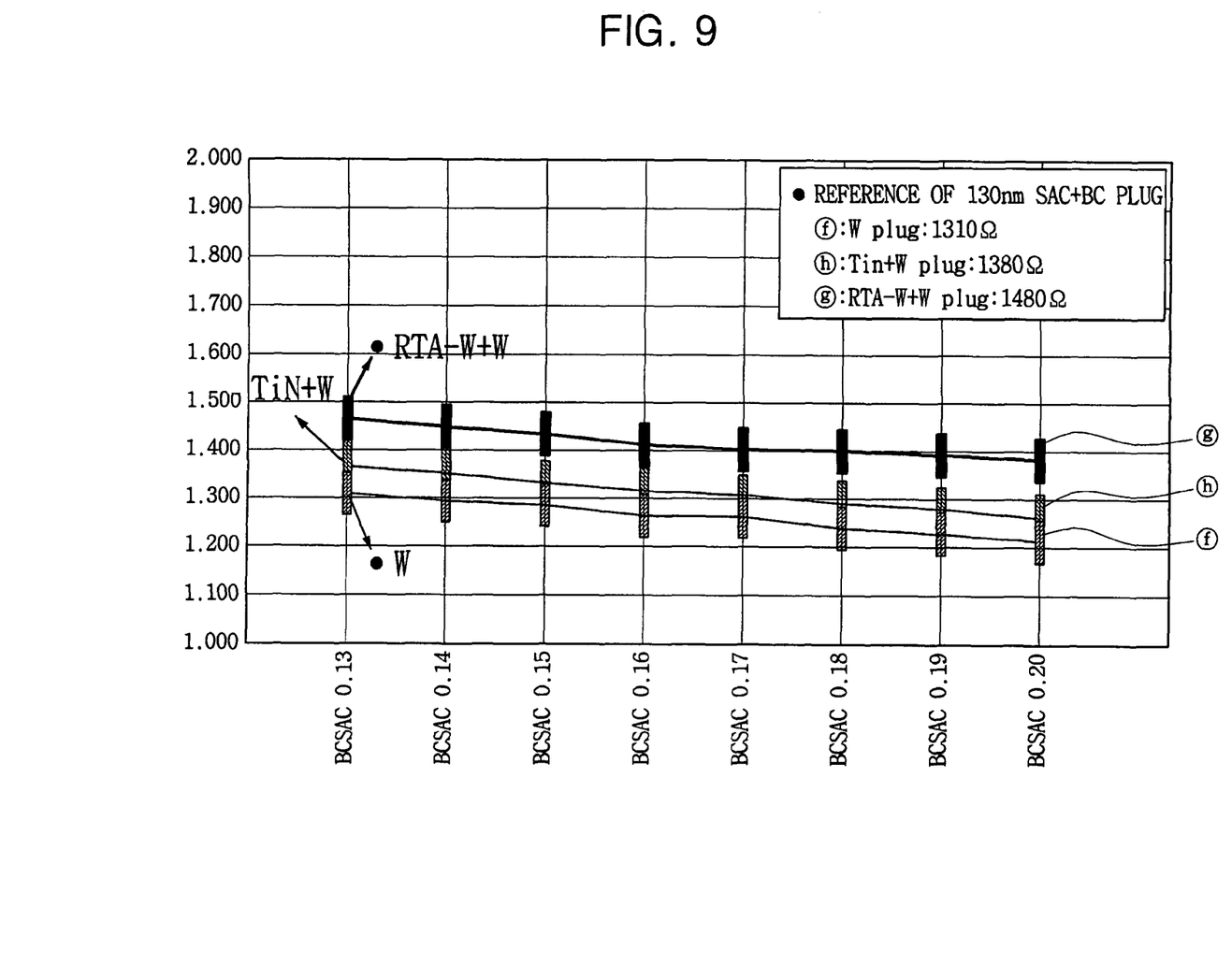
FIG. 9 illustrates a graph of resistance values of reference tungsten that is not processed by RTA, a titanium nitride layer, and tungsten processed by RTO and buffing CMP in a 130-nm buried contact (BC)-self-aligned contact (SAC) plug according to an exemplary embodiment.

FIG. 9 illustrates a graph of resistance values of reference tungsten that is not processed by RTA, a titanium nitride layer, and tungsten processed by RTO and buffing CMP in a 130-nm buried contact (BC)-self-aligned contact (SAC) plug according to an exemplary embodiment.

As illustrated in FIG. 9, it can be also seen that the resistance value (g) of the tungsten that is processed by RTO and buffing CMP is higher than a resistance determined from a resistive capacitive (RC) resistance evaluation of a 130-nm buried contact (BC)-self-aligned contact (SAC) plug after application to a product lot. More particularly, in the exemplary cases illustrated in the graph of FIG. 9, the resistance value (g) of the RTO and buffing CMP processed tungsten is higher by about 100Ω to 200Ω than the resistance value (f) of the reference tungsten. While an increase of about 100Ω to 200Ω may not be considered large and may enable such an RTO and buffing CMP processed tungsten plug, e.g., 140r", 140p" to be used in many applications, such an increase in resistance may hinder employing such an RTO and buffing CMP processed tungsten plug, e.g., 140r", 140p", in some applications, e.g., a product that may be vulnerable to RC delay. Further, referring to FIG. 9, it may be seen that a resistance of a titanium nitride layer may be less than a resistance of an RTO and buffing CMP processed tungsten plug, e.g., 140*r*'', 140*p*''.

In some embodiments, to reduce a resistance of an RTO and buffing CMP processed tungsten plug, e.g., 140*r*'', 140*p*'', a metal oxide ($Me_\xi O_\psi$) may be reduced to pure metal (Me) using a chemical reaction in a reducing gas atmosphere, thereby decreasing the resistance of a metal contact plug. For example, the tungsten contact plug, e.g., 140*r*'', 140*p*'', processed by RTO and buffing CMP may be reduced by a heating method and/or plasma method such that the contact resistance of tungsten may be decreased. It is generally understood that a substance including atoms, molecules or ions is reduced when it gains electrons.

Figure 10:
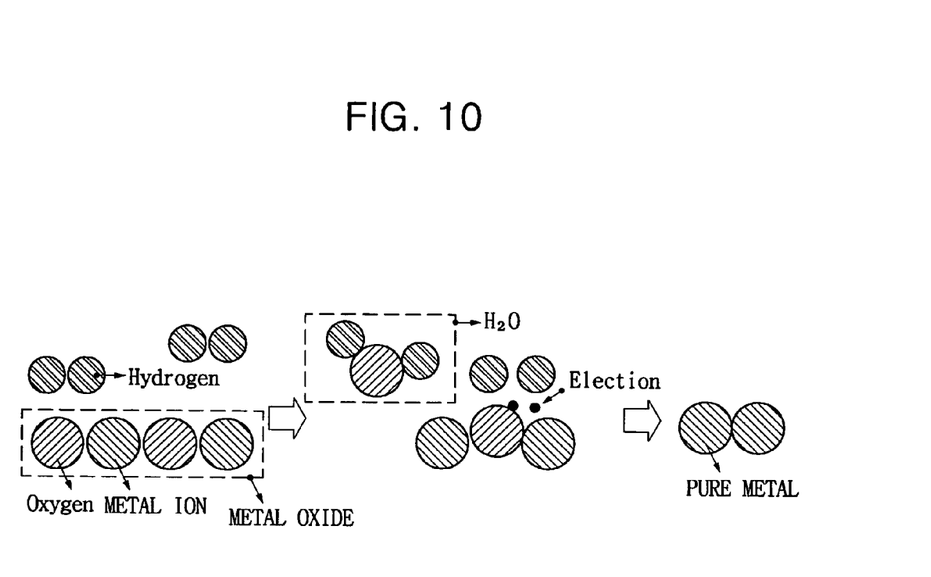
FIG. 10 illustrates a diagram of a reduction process of a metal oxide to a pure metal.

FIG. 10 illustrates a diagram of a reduction process of a metal oxide to a pure metal. As illustrated in FIG. 10, during a reduction process, metal ions of an oxide crystal lattice gain hydrogen electrons, and the oxide crystal lattice is transformed into a metal crystal lattice. Referring to FIG. 10, when metal oxide ($Me_\xi O_\psi$) formed in a high-temperature oxygen atmosphere is processed by RTA in a high-temperature hydrogen or ammonia atmosphere, oxygen atoms may strongly vibrate due to heat energy. Thus, hydrogen molecules may easily attach to the metal oxide ($Me_\xi O_\psi$), overcome a binding force of the oxygen atoms, and form water ($H_2O$). As a result of such a process, the metal oxide ($Me_\xi O_\psi$) may give rise to pure metal (Me).

Characteristics of such a reduction reaction may depend on hydrogen pressure, reaction temperature, reaction time, etc. For example, when hydrogen pressure is high, hydrogen atoms may increase and easily react with the metal oxide ($Me_\xi O_\psi$). Characteristics of the reduction reaction may actually be considerably affected by reaction temperature. For example, the metal oxide ($Me_\xi O_\psi$) may react with hydrogen at a specific temperature or higher. The higher the temperature, the more actively the reduction reaction may proceed. For example, in a hydrogen atmosphere, the reaction temperatures of metal oxides $Cu_2O$ and PdO may be 753 K and 833 K, respectively.

Figure 11:
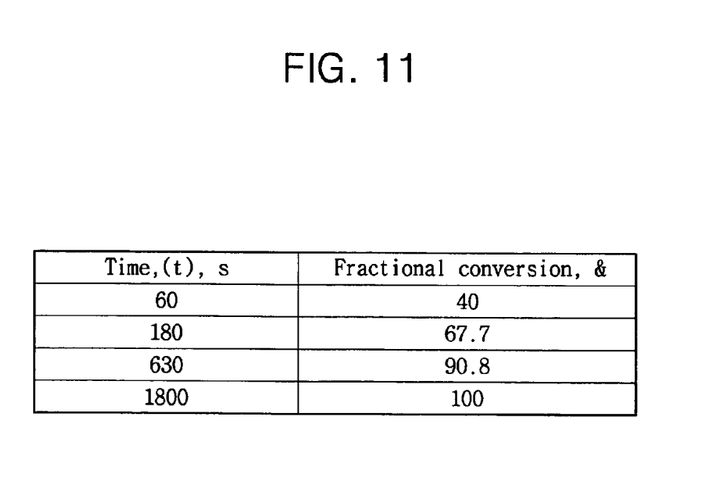
FIG. 11 illustrates a table showing a relationship between a reaction time and a degree of a metal oxide resulting in a pure metal.

Results of the reduction reaction may also relate to reaction time. For example, a reaction formula may be $f=f(t, PH_2)$, where f is a speed at which a metal oxide is reduced to pure metal, t is a hydrogen reaction time of the metal oxide, and $PH_2$ is a hydrogen partial pressure. FIG. 11 illustrates a table showing a relationship between a reaction time and a degree of a metal oxide resulting in a pure metal. Referring to FIG. 11, e.g., in such cases, the longer the reaction time t at a hydrogen partial pressure $PH_2$ of 101.3 kPa and a reaction temperature T of 1273 K in a reduction process, the more a metal oxide ($Fe_2O_3$) may be transformed into pure metal (Fe).

As discussed above, an RTO contact plug that is processed by RTO and buffing CMP may have an improved profile because, e.g., a seam and/or other partial step may be at least partially removed by the oxidation and buffing processes, however, a contact resistance may increase, which may hinder use of such an RTO contact plug for some applications. For such applications, the resistance of the RTO contact plug may be reduced by, e.g., a reduction process.

Figure 12:
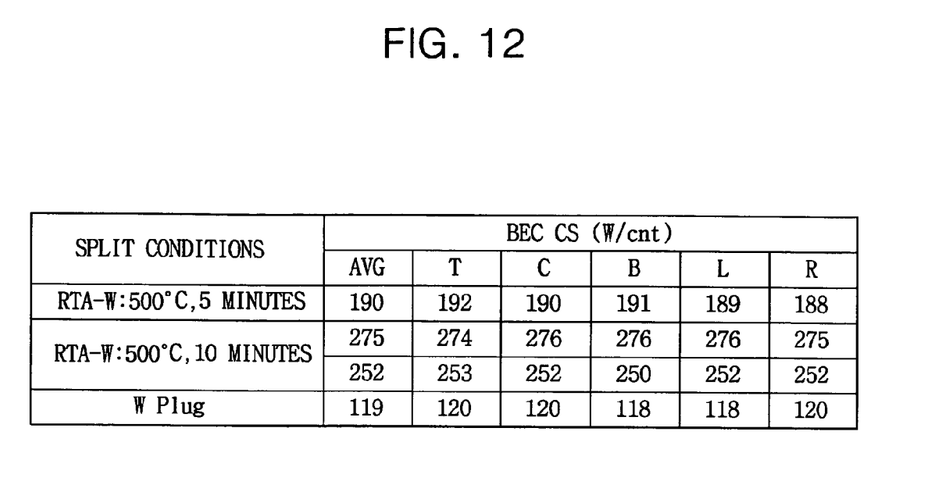
FIGS. 12 and 13 illustrate a table and a graph setting forth resistance values of reference tungsten, tungsten oxidized through a RTA process at a high temperature of 500° C. in an oxygen atmosphere for five minutes, and tungsten oxidized in the same condition through a RTA process for ten minutes according to exemplary embodiments.
Figure 13:
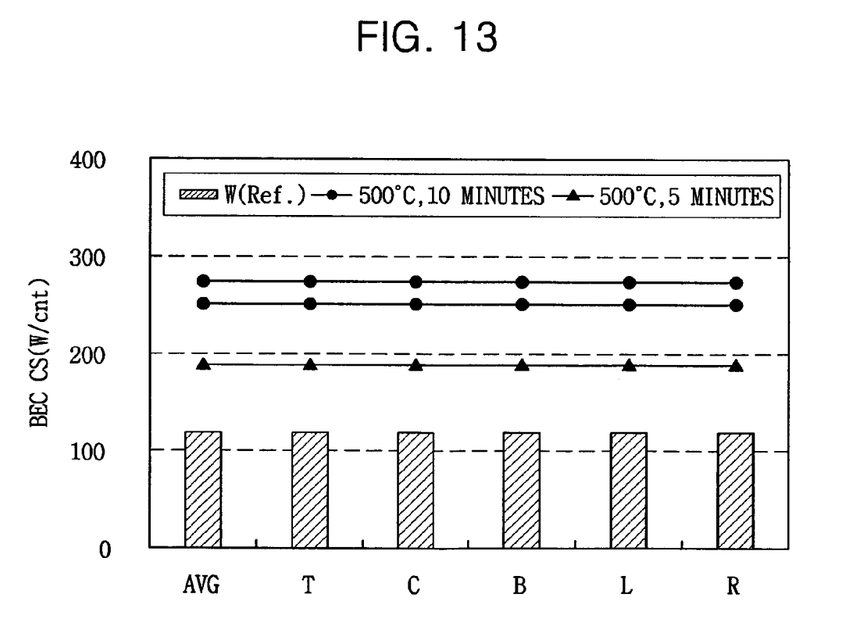

FIGS. 12 and 13 illustrate a table and a graph setting forth resistance values of reference tungsten, tungsten oxidized through a RTA process at a high temperature of 500° C. in an oxygen atmosphere for five minutes, and tungsten oxidized in the same condition through a RTA process for ten minutes according to exemplary embodiments. Referring to FIGS. 12 and 13, when tungsten is processed by RTA at a high temperature of 500° C. in an oxygen atmosphere for five minutes, the tungsten is oxidized and has a resistance value increased by about 70Ω in comparison with reference tungsten. Also, when tungsten is processed by RTA at a high temperature of 500° C. for ten minutes, the tungsten is oxidized and has a resistance value increased by about 140Ω in comparison with the reference tungsten. Thus, it can be seen that RC resistance is linearly proportional to the reaction time t.

Figure 14:
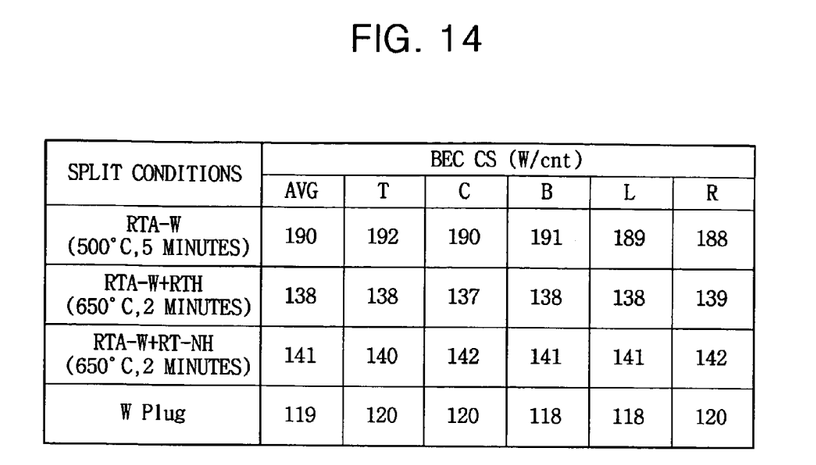
FIGS. 14 and 15 illustrate a table and a graph setting forth resistance values of reference tungsten, tungsten processed at a high temperature of 500° C. by RTA and buffing CMP for five minutes, tungsten obtained by reducing a tungsten oxide in a hydrogen atmosphere at 650° C. for two minutes, and tungsten obtained by reducing the tungsten oxide in an ammonia atmosphere at 650° C. for two minutes according to other exemplary embodiments.
Figure 15:
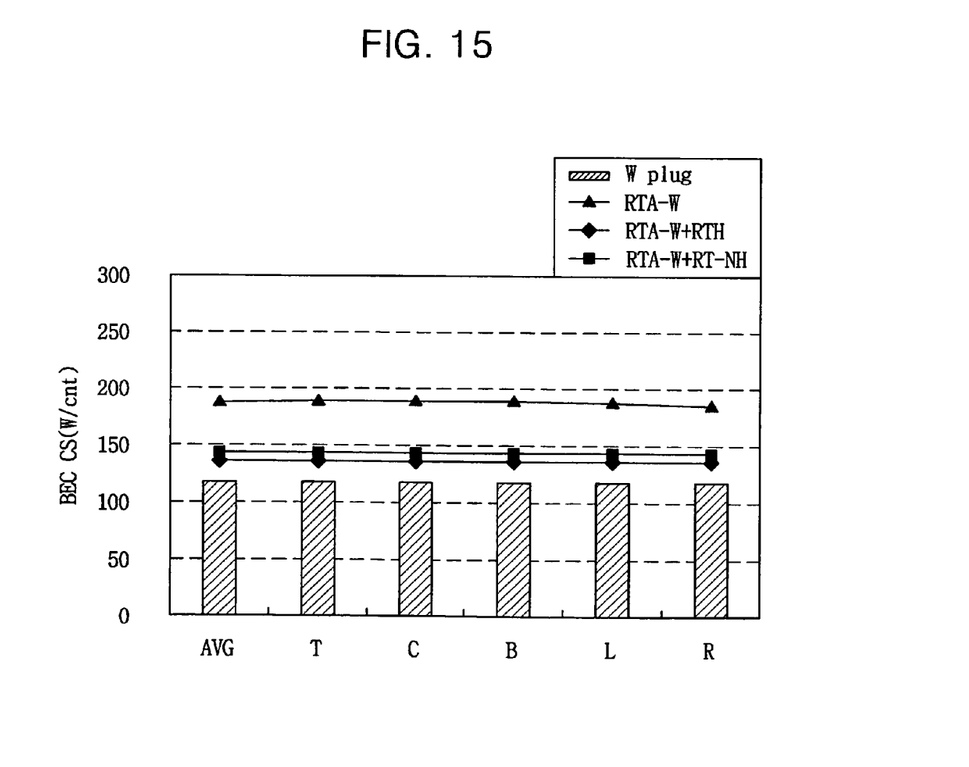

FIGS. 14 and 15 illustrate a table and a graph setting forth resistance values of reference tungsten, tungsten processed at a high temperature of 500° C. by RTA and buffing CMP for five minutes, tungsten obtained by reducing a tungsten oxide in a hydrogen atmosphere at 650° C. for two minutes, and tungsten obtained by reducing the tungsten oxide in an ammonia atmosphere at 650° C. for two minutes according to other exemplary embodiments. When a metal oxide that is oxidized and buffed at a high temperature of 500° C. for five minutes is processed at 650° C. in a hydrogen or ammonia atmosphere for two minutes, the resistance is decreased by about 50Ω due to the reduction process.

Figure 16:
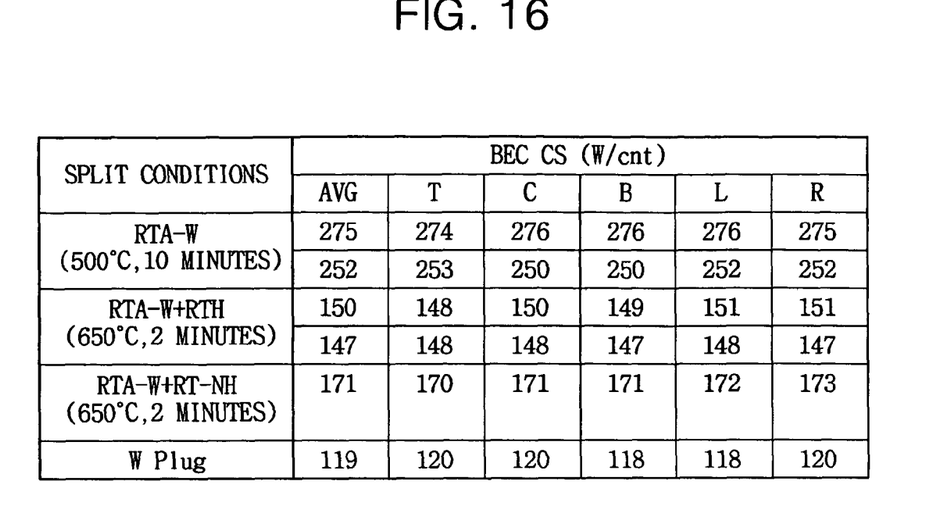
FIGS. 16 and 17 illustrate a table and a graph setting forth resistance values of reference tungsten, tungsten processed at a high temperature of 500° C. by RTA and buffing CMP for ten minutes, tungsten obtained by reducing a tungsten oxide in a hydrogen atmosphere at 650° C. for two minutes, and tungsten obtained by reducing the tungsten oxide in an ammonia atmosphere at 650° C. for two minutes according to other exemplary embodiments.
Figure 17:
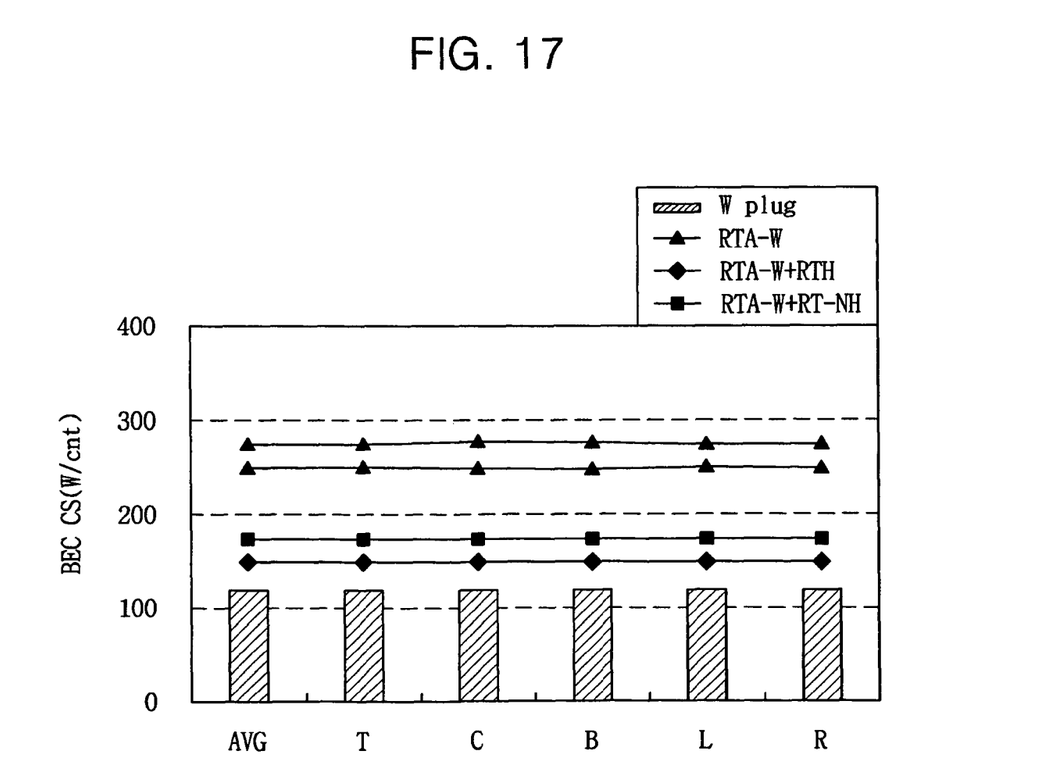

FIGS. 16 and 17 illustrate a table and a graph setting forth resistance values of reference tungsten, tungsten processed at a high temperature of 500° C. by RTA and buffing CMP for ten minutes, tungsten obtained by reducing a tungsten oxide in a hydrogen atmosphere at 650° C. for two minutes, and tungsten obtained by reducing the tungsten oxide in an ammonia atmosphere at 650° C. for two minutes according to other exemplary embodiments. When a metal oxide that is oxidized and buffed at a high temperature of 500° C. for ten minutes is processed at 650° C. in a hydrogen or ammonia atmosphere for two minutes, the resistance is decreased by about 100Ω due to the reduction process.

In some embodiments, to decrease a resistance of a tungsten contact plug that has been subjected to oxidation, the tungsten contact plug may be subjected to a reduction process during which the tungsten oxide ($W_\xi O_\psi$) may be transformed to pure tungsten (W) by performing, e.g., a rapid thermal hydrogenation (RTH) or rapid thermal ammoniation (RTNH) in a hydrogen or ammonia atmosphere. In some embodiments, to decrease a resistance of a tungsten contact plug that is transformed into tungsten oxide during an oxidation process, the tungsten oxide may be processed by rapid thermal nitridation (RTN) in a nitrogen gas atmosphere and nitrided. As a result, the tungsten oxide may be transformed into pure tungsten. In some embodiments, the oxidized tungsten contact plug may be heat-treated in a high-temperature $CH_4$ atmosphere, and may thereby decrease the contact resistance. In some embodiments, the RTH or RTNH may include a heating process during which heating method is performed on the tungsten oxide ($W_\xi O_\psi$) at a high temperature of 400° C. or more.

As described above, in embodiments, a speed at which the tungsten oxide ($W_\xi O_\psi$) is reduced to the tungsten (W) when hydrogen or ammonia molecules react with the tungsten oxide ($W_\xi O_\psi$) may be proportional to a hydrogen pressure, a reaction temperature, and a reaction time t.

As described above, when tungsten is deposited on an interlayer insulating layer to fill a contact hole, a seam may be formed as tungsten grains grow from three sides. Also, when tungsten deposited to overfill the contact hole is processed by CMP, the tungsten may have a rough surface as a result of, e.g., excessive etching of the tungsten due to a low oxide-to-tungsten selectivity such that the contact hole may be dished, excessive etching of the oxide due to a high oxide-to-tungsten selectivity such that the contact hole may protrudes, etc. To remove at least the partial step, the tungsten in the contact hole may be volumetrically expanded. That is, e.g., the tungsten in the contact hole may be volumetrically expanded by subjecting the tungsten to RTA in a high-temperature oxygen atmosphere. As a result, surface roughness may be reduced and/or eliminated, i.e., partial step may be removed. A portion of the tungsten that has expanded upward may be removed by buffing CMP. However, the oxidation of tungsten may deteriorate, e.g., increase, contact resistance. To decrease the contact resistance increased due to heat treatment, the tungsten may be heat-treated again in a high-temperature hydrogen atmosphere. In such embodiments, the tungsten oxide may be transformed into pure tungsten by a reduction reaction.

Embodiments may provide a contact plug formed, e.g., of tungsten, that has better step coverage, e.g., as compared to aluminum, and has relatively less resistivity and improved electrical characteristics.

Embodiments may separately provide a contact plug having a reduced surface roughness, e.g., by removing a partial step, a recessed portion, a protruding portion, or at least a portion of a seam etc, by heating, e.g., the tungsten in a high temperature in an oxygen atmosphere such that the tungsten may expand volumetrically. As a result, the partial step of a seam, a recessed portion, a protruding portion, etc., may be reduced and/or eliminated.

Embodiments may separately provide a method of reducing contact resistance by subjecting a metal oxide that may have resulted from subjecting the metal plug to a high temperature in an oxygen atmosphere to a reduction process such that the metal oxide, e.g., tungsten oxide, may be transformed into a pure metal, e.g., pure tungsten, having a relatively low contact resistance. The reduction process may be, e.g., a RTA process based on a heating or plasma method in a hydrogen atmosphere.

The foregoing is illustrative of exemplary embodiments and is not to be construed as limiting thereof. Although only a few exemplary embodiments have been described, those skilled in the art will readily appreciate that many modifications are possible in example embodiments without materially departing from the novel teachings and advantages. Accordingly, all such modifications are intended to be included within the scope of this invention as defined in the claims. Therefore, it is to be understood that the foregoing is illustrative of various example embodiments and is not to be construed as limited to the specific embodiments disclosed, and that modifications to the disclosed embodiments, as well as other embodiments, are intended to be included within the scope of the appended claims.

What is claimed is:

1. A method of fabricating a semiconductor device, comprising:
depositing tungsten on an insulating layer in which a contact hole is formed by chemical vapor deposition (CVD);
performing chemical mechanical planarization (CMP) on the tungsten to expose the insulating layer and form a tungsten contact plug;
performing rapid thermal oxidation (RTO) on the tungsten contact plug in an oxygen atmosphere such that the tungsten expands volumetrically into tungsten oxide,
after performing the RTO, removing a part of the tungsten oxide that has volumetrically expanded upward from a surface of the insulating layer by buffing CMP, wherein removing a part of the tungsten oxide includes flattening a surface of the tungsten oxide to be at a same level as the surface of the insulating layer; and
after the buffing CMP, reducing the tungsten oxide and transforming the tungsten oxide to metallic tungsten by performing rapid thermal hydrogenation (RTH) or rapid thermal ammoniation (RTNH) on the contact plug in a hydrogen or ammonia atmosphere.

2. The method as claimed in claim 1, wherein the RTO includes a heating process of heating the tungsten at a high temperature of 400° C. or more for one minute or more and/or a plasma process of heating the tungsten at a power of 20 watts or more for one minute or more.

3. The method as claimed in claim 1, wherein:
the insulating layer includes an oxide, and
the CMP performed before performing the RTO is a single step process during which a ratio of oxygenated water used as a slurry to a total content is 2% or more, and the tungsten has a higher etch selectivity than the oxide of the insulating layer, such that the tungsten contact plug is dished while a part of the tungsten having the higher etch selectivity is recessed, and
the dished tungsten contact plug expands volumetrically in random directions during the RTO.

4. The method as claimed in claim 1, wherein:
the insulating layer includes an oxide, and
the CMP performed before performing the RTO includes two steps, such that:
during a first step, a ratio of oxygenated water used as a slurry to a total content is 2% or more, the tungsten has a higher etch selectivity than the oxide of the insulating layer, and a part of the tungsten having the higher etch selectivity is recessed, and
during a second step, a ratio of oxygenated water used as a slurry to a total content is 0.5% or less, the tungsten has a lower etch selectivity than the oxide of the insulating layer, and the tungsten contact plug protrudes while the oxide having the higher etch selectivity is removed such that a surface of the tungsten protrudes, and
the protruding tungsten contact plug expands uniformly and volumetrically in vertical directions during the RTO.

5. The method as claimed in claim 1, wherein the RTH or RTNH includes a heating process during which heating method is performed on the tungsten oxide at a high temperature of 400° C. or more.

6. The method as claimed in claim 1, wherein a speed at which the tungsten oxide is reduced to the metallic tungsten when hydrogen or ammonia molecules react with the tungsten oxide is proportional to a hydrogen pressure, a reaction temperature, and a reaction time.

7. The method as claimed in claim 1, wherein the RTH or RTNH includes a plasma process.

8. A method of fabricating a semiconductor device including a semiconductor substrate on which an oxide insulating layer is formed and includes at least one contact hole formed therein, the method comprising:
depositing tungsten on the semiconductor substrate including the contact hole until the contact hole is overfilled;
forming a tungsten contact plug by planarizing the semiconductor substrate including the tungsten using a chemical mechanical planarization (CMP) process until the insulating layer is exposed;
performing rapid thermal oxidation (RTO) on the tungsten contact plug in an oxygen atmosphere and oxidizing the tungsten to tungsten oxide;
removing a part of the tungsten oxide that has volumetrically expanded upward from the surface of the insulating layer when the tungsten is oxidized to the tungsten oxide by buffing CMP, wherein removing a part of the tungsten oxide includes flattening a surface of the tungsten oxide to be at a same level as the surface of the insulating layer, and
reducing the tungsten oxide into metallic tungsten.

9. The method as claimed in claim 8, wherein reducing the tungsten oxide to metallic tungsten includes reducing the tungsten oxide into metallic tungsten by performing rapid thermal hydrogenation (RTH) or rapid thermal ammoniation (RTNH) on the contact plug in a hydrogen or ammonia atmosphere.

10. The method as claimed in claim 8, wherein reducing the tungsten oxide into metallic tungsten includes reducing the tungsten oxide into metallic tungsten by performing rapid thermal nitridation (WIN) on the tungsten oxide in a nitrogen atmosphere and nitriding the tungsten oxide.

11. A method of fabricating a semiconductor device, the method comprising:
    forming a tungsten contact plug in a contact hole of an insulating layer using a chemical vapor deposition (CVD) process and a chemical mechanical planarization (CMP) process;
    oxidizing the tungsten contact plug using rapid thermal annealing (RTA) in an oxygen atmosphere;
    flattening a surface of the oxidized tungsten contact plug using a buffing CMP process, wherein flattening the surface of the oxidized tungsten contact plug using the buffing CMP process includes flattening the surface of the oxidized tungsten contact plug to be at a same level as a surface of the insulating layer, and
    reducing the oxidized tungsten contact plug by performing rapid thermal hydrogenation (RTH) or rapid thermal ammoniation (RTNH) in a hydrogen or ammonia atmosphere.

12. The method as claimed in claim 11, wherein flattening the surface of the oxidized tungsten contact plug using the buffing CMP process further includes removing a part of an oxidized region of the tungsten contact plug formed by oxidizing the tungsten contact plug.

13. The method as claimed in claim 11, wherein oxidizing the tungsten contact plug includes oxidizing a surface of the tungsten contact plug.

\* \* \* \* \*